United States Patent
Okazaki et al.

(10) Patent No.: US 7,889,467 B2
(45) Date of Patent: Feb. 15, 2011

(54) PROTECTION CIRCUIT, AND SEMICONDUCTOR DEVICE AND LIGHT EMITTING DEVICE USING SUCH PROTECTION CIRCUIT

(75) Inventors: Mitsuru Okazaki, Kyoto (JP); Naoki Takahashi, Kyoto (JP); Akira Shimizu, Kyoto (JP); Kenichi Nakata, Kyoto (JP)

(73) Assignee: Rohm Co., Ltd. (JP)

( * ) Notice: Subject to any disclaimer, the term of this patent is extended or adjusted under 35 U.S.C. 154(b) by 673 days.

(21) Appl. No.: 11/915,921

(22) PCT Filed: May 29, 2006

(86) PCT No.: PCT/JP2006/310685

§ 371 (c)(1),
(2), (4) Date: Nov. 29, 2007

(87) PCT Pub. No.: WO2006/129613

PCT Pub. Date: Dec. 7, 2006

(65) Prior Publication Data

US 2009/0309117 A1   Dec. 17, 2009

(30) Foreign Application Priority Data

May 30, 2005   (JP) .............................. 2005-156594

(51) Int. Cl.
*H02H 9/00* (2006.01)
(52) U.S. Cl. ....................................................... 361/56
(58) Field of Classification Search .................... 361/56
See application file for complete search history.

(56) References Cited

U.S. PATENT DOCUMENTS 4,649,565 A * 3/1987 Kaizer et al. ................... 381/96
4,864,609 A * 9/1989 Moisin ........................ 379/413
5,561,391 A * 10/1996 Wellnitz et al. ............. 327/309

FOREIGN PATENT DOCUMENTS

| JP | 60-74467 A | 4/1985 |
| JP | 6-140576 A | 5/1994 |
| JP | 9-186249 A | 7/1997 |
| JP | 2005-65083 A | 3/2005 |

OTHER PUBLICATIONS

Written Opinion of the International Searching Authority for PCT/JP2006-310685; date of issuance: Dec. 6, 2007.
International Search Report for International Application No. PCT/JP2006/310685 mailed Sep. 5, 2006.

* cited by examiner

*Primary Examiner*—Stephen W Jackson
(74) *Attorney, Agent, or Firm*—Cantor Colburn LLP

(57) ABSTRACT

In a protection circuit connected, via lines including an inductance component, to a circuit to be protected, a first transistor is arranged on a path to ground from a connection point of the protection circuit and the line. A second transistor is arranged on a path to ground from a connection point of the circuit to be protected and the line, and extracts, from a connection point, a current corresponding to a current flowing in the first transistor. The first and the second transistors are NPN bipolar transistors having a base and an emitter are commonly connected. A resistor is connected between the base and the emitter of the first transistor, and a diode is connected between the base and a collector.

7 Claims, 5 Drawing Sheets

PROTECTION CIRCUIT, AND SEMICONDUCTOR DEVICE AND LIGHT EMITTING DEVICE USING SUCH PROTECTION CIRCUIT

BACKGROUND OF THE INVENTION

1. Field of the Invention

The present invention relates to circuit protection technology for protecting a circuit to be protected, from surge voltages and the like.

2. Description of the Related Art

Many semiconductor integrated circuits are used in various electronic devices, starting from mobile telephones, PDAs (Personal Digital Assistants), and laptop personal computers, or electrical systems in automobiles. Since usage in all kinds of conditions is envisaged for such semiconductor integrated circuits, high reliability is required. In order to improve reliability, in general, a protection circuit is provided for each bonding pad of an input-output terminal connected to the outside of a circuit.

Among such protection circuits, a voltage clamp circuit may be provided so that the reliability of an internal circuit that is to be protected (referred to as a protected circuit, below), does not deteriorate, even in cases in which a surge voltage or the like is precipitously applied. Circuit protection technology by this kind of voltage clamp circuit is described, for example, in Patent Document 1.

Here, as an example, a protection circuit of a driver circuit 200 of an LED (Light Emitting Diode) shown in FIG. 1 is examined. The LED driver circuit 200 is, for example, a circuit for driving the LED 24 provided as illumination of a meter of an automobile. A battery voltage outputted from a battery 20 is applied via a resistor 22 to an anode of the LED 24. Furthermore, for the cathode of the LED 24, there is a connection to a drive transistor M1 of the LED driver circuit 200. A controller 26 controls gate voltage of the drive transistor M1, and, by regulating current flowing in the LED 24, controls emitted light intensity of the LED 24.

Since voltage outputted from the battery 20 is unstable, for a semiconductor integrated circuit used for this type of application, reliability is required particularly against surge voltages and the like. At the same time, in the LED driver circuit 200 of FIG. 1, breakdown voltage of the drive transistor M1 becomes a problem. Accordingly, a protection circuit 100, which clamps voltage applied to a drain of the drive transistor M1, is arranged in parallel to the drive transistor M1.

Patent Document 1: Japanese Patent Application, Laid Open No. H6-140576

FIG. 2 is a plan view of the LED driver circuit 200 of FIG. 1 seen from above. The LED driver circuit 200 is integrated on a semiconductor substrate 30, and the semiconductor substrate 30 is mounted on a base 32 for a package. A protected circuit 110 integrated on the semiconductor substrate 30 includes a drive transistor M1 of FIG. 1. With regard to the drive transistor M1, which is the protected circuit 110, since it is necessary to inspect breakdown voltage in a state in which the protection circuit 100 is not used, that is, as a single unit, a dedicated bonding pad 34 is provided. The protection circuit 100 also is provided with another bonding pad 36, and the protection circuit 100 and the protected circuit 110 are connected to one another by bonding wires W1 and W2, via a bonding pad 38 arranged on the base 32. The bonding pad 38 is connected to an external electrode of a package, and this external electrode is connected to a cathode of the LED 24 of FIG. 1.

In this way, the protection circuit 100 and the protected circuit 110 are connected via the bonding wires W1 and W2, which are lines that include a significant inductance component.

FIG. 3 is an equivalent circuit diagram of the LED driver circuit 200 of FIG. 1.

The protection circuit 100 is provided with a first transistor Q1, a diode D1, and a resistor R3.

The first transistor Q1 is an NPN bipolar transistor, and is arranged on a path to ground, from the bonding pad 34, which is a connection point of the present protection circuit 100 and the bonding wire W1. The diode D1 is connected between a base and a collector of the first transistor Q1, and the resistor R3 is arranged between the base and an emitter of the first transistor Q1.

In the figure, C1 and C2 represent parasitic capacitances in the LED driver circuit 200; the parasitic capacitance C1 is mainly collector-emitter capacitance of the first transistor Q1 of the protection circuit 100, and the parasitic capacitance C2 is drain-source capacitance of the drive transistor M1 inside the protected circuit 110. Furthermore, the bonding wires W1 and W2 respectively include resistance components R1 and R2, and inductance components L1 and L2. Included in the resistance components R1 and R2 are not only the bonding wires W1 and W2, but also IC chip internal wiring resistance.

When voltage of the bonding pad 38 rises due to occurrence of a surge voltage, voltage Va of the bonding pad 34 rises therewith. When the voltage Va of the bonding pad 34 exceeds a Zener voltage Vz of the diode D1, a reverse current directed from cathode to anode flows, the first transistor Q1 is ON, and a current is extracted from the bonding pad 34. As a result, voltages Va and Vb of the bonding pad 34 and the bonding pad 36 are clamped, and it is possible to prevent application of a high voltage to the protected circuit 110.

With the protection circuit 100 configured in this way, problems described below arise. FIG. 4 is a voltage waveform diagram of the LED driver circuit 200 of FIG. 3, and shows a time waveform of the voltage Va of the bonding pad 34 and the voltage Vb of the bonding pad 36 of FIG. 3.

At time T0, when a surge voltage is inputted from the bonding pad 38, both of the voltages Va and Vb of the bonding pad 34 and 36 rise. When the voltage Va of the bonding pad 34 rises and exceeds the Zener voltage Vz of the diode D1, a reverse current directed from cathode to anode of the diode D1 flows, and the first transistor Q1 is ON.

If base-emitter voltage of the first transistor Q1 is taken as Vbe, the voltage Va of the bonding pad 34 is clamped close to Vmax=Vz+Vbe, as shown in FIG. 4.

However, as shown in FIG. 3, parasitic capacitances of different capacitance values exist for each of the bonding pad 34 and the bonding pad 36. If C1>C2, charge stored in the parasitic capacitance C2 of the protected circuit 110 is extracted by the protection circuit 100. At this time, the charge stored in the parasitic capacitance C2 is discharged by the protection circuit 100 via the bonding wires W1 and W2, which include the inductance components L1 and L2.

By a current flowing in the inductance components L1 and L2, LCR resonance is generated by the parasitic capacitances C1 and C2, the resistors R1 and R2, and the inductance components L1 and L2 included in the bonding wires W1 and W2, and a reverse voltage is generated with respect to the inductance components L1 and L2. As a result, the voltage Vb of the bonding pad 36 rises while oscillating, and the oscillation continues even after time T1 at which the voltage Va of the bonding pad 34 is clamped at the voltage Vmax. As a result, for the protected circuit 110, there have been cases in which voltage exceeding the voltage Vmax is applied, and there has been room for improvement in functionality of the protection circuit 100.

SUMMARY OF THE INVENTION

The present invention has been made in view of these problems, and a general purpose thereof is to provide a protection circuit which enables a voltage clamp that suppresses oscillation, and also a semiconductor device using the protection circuit.

An embodiment of the present invention relates to a protection circuit connected, via a line including a significant inductance component, to a circuit to be protected. The protection circuit is provided with a first transistor arranged on a path to ground from a connection point of the protection circuit and the line, and a second transistor arranged on a path to ground from a connection point of the circuit to be protected and the line, the second transistor extracting, from the connection point, a current corresponding to a current flowing in the first transistor.

The "significant inductance component" is an inductance component of a level forming an oscillation circuit and a parasitic capacitance within a circuit.

According to the embodiment, when a surge voltage occurs, a current due to the second transistor in addition to the first transistor is extracted. As a result, since a current is extracted from both ends of a wire including the significant inductance component, LCR oscillation can be suppressed, and voltage oscillation can be suppressed.

The first and the second transistors may be bipolar transistors whose base and emitter are commonly connected. In such cases, by adjusting size ratio of the first transistor and the second transistor, a constant current in accordance with the size ratio of the transistors can be extracted.

The first and the second transistors are NPN bipolar transistors; a collector of the first transistor may be connected to a connection point of the protection circuit and the wire; a collector of the second transistor may be connected to a connection point of the circuit to be protected and the wire; and a commonly connected emitter may be grounded. The protection circuit may be further provided with a resistor arranged between a base and an emitter of the first transistor, and a diode, with a cathode connected to a collector of the first transistor, and an anode connected to the base of the first transistor.

Transistor sizes of the first and the second transistor may be configured to be approximately the same.

By the size of the first and the second transistors being approximately the same, electrical current amount extracted by each of the transistors can be made approximately equal, and it is possible to suppress oscillation.

The protection circuit may be integrated on the same semiconductor substrate as the circuit to be protected; the circuit to be protected and the protection circuit may each be provided with bonding pads; and each of the bonding pads may be connected by a bonding wire equivalent to the wire, via a terminal arranged on a base on which the semiconductor substrate is mounted.

Another embodiment of the present invention is a semiconductor device. The device is provided with a driver circuit, which is connected to a cathode of a light emitting diode, and which controls emitted quantity of light of the light emitting diode, and with the abovementioned protection circuit provided with the driver circuit as the circuit to be protected.

According to this embodiment, the driver circuit can be protected from a surge voltage and the like, and it is possible to raise reliability of the semiconductor device.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

Figure 1:
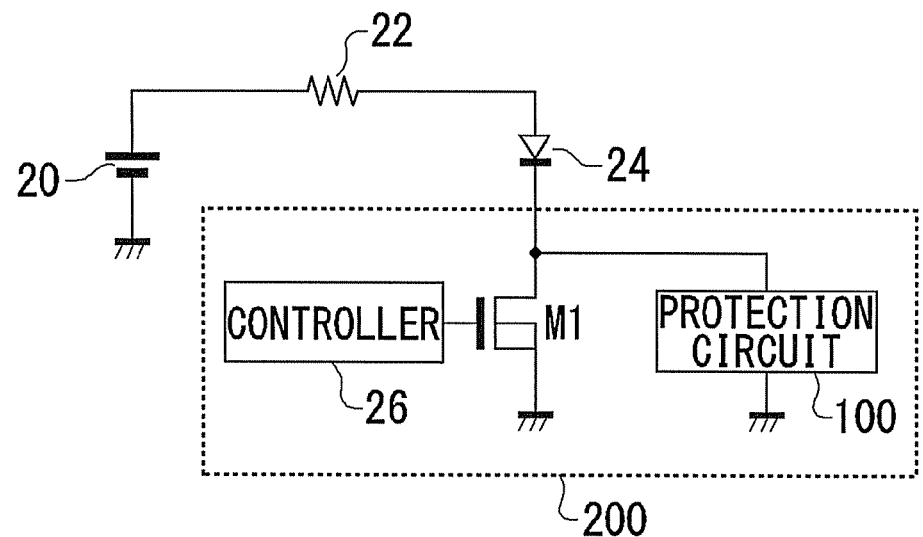
FIG. 1 is a circuit diagram of a driver circuit of a general LED provided with a protection circuit.
Figure 2:
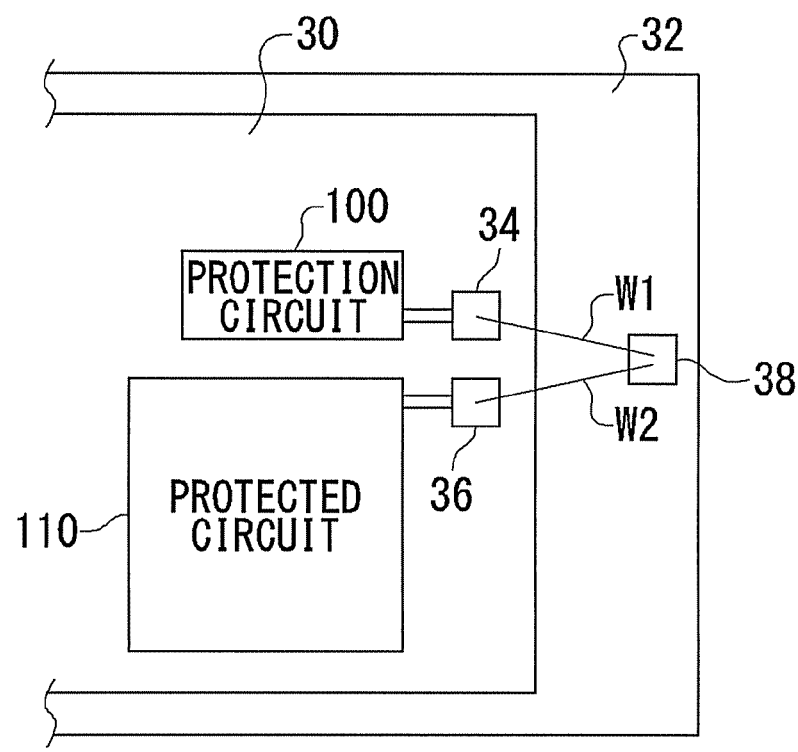
FIG. 2 is a plan view seen from above, of the LED driver circuit of FIG. 1.
Figure 3:
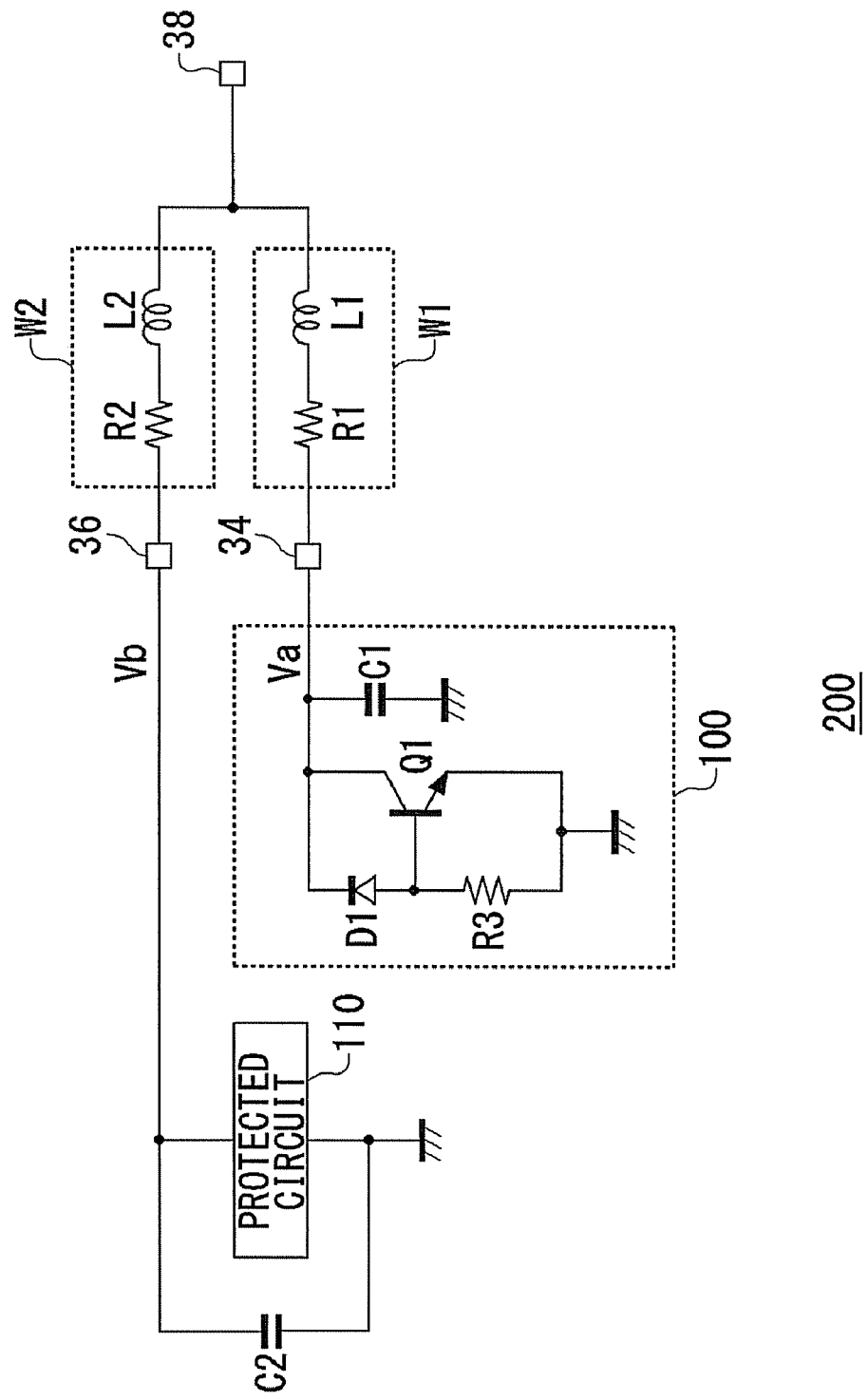
FIG. 3 is an equivalent circuit diagram of the LED driver circuit of FIG. 1.
Figure 4:
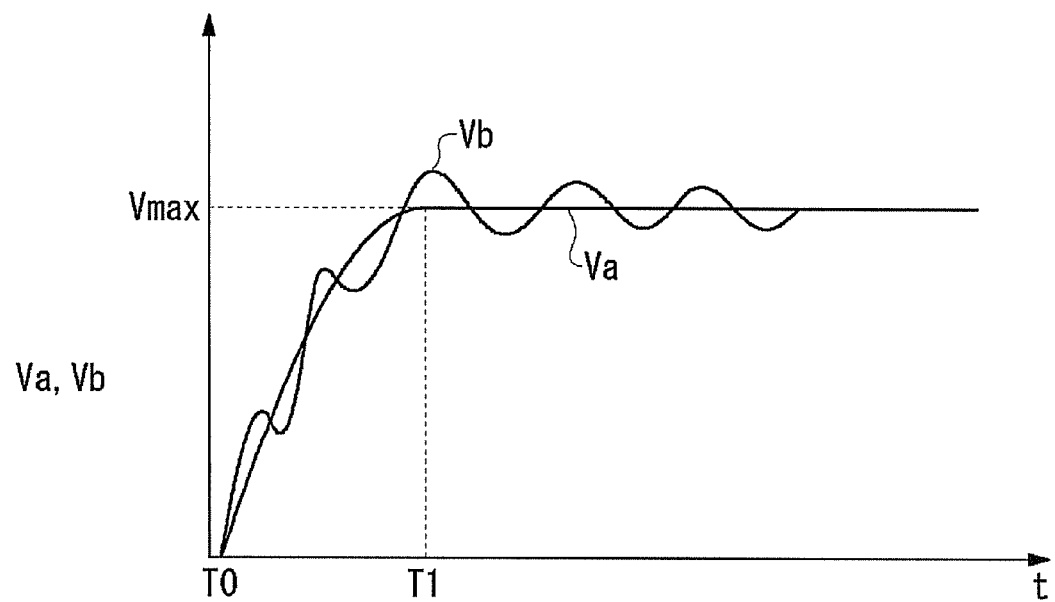
FIG. 4 is a voltage waveform diagram of the LED driver circuit of FIG. 3.

A protection circuit 100 according to the present embodiment is used, for example, in an LED driver circuit 200 described in FIG. 1. As shown in FIG. 2, also in the present embodiment, the protection circuit 100 and a protected circuit 110, that is to be protected, are integrated on the same semiconductor substrate 30, and the protection circuit 100 and the protected circuit 110 are respectively provided with bonding pads 34 and 36.

The bonding pads 34 and 36 are connected by bonding wires W1 and W2 that are lines including significant inductance components, via a bonding pad 38 arranged on a base 32, on which the semiconductor substrate 30 is mounted.

Figure 5:
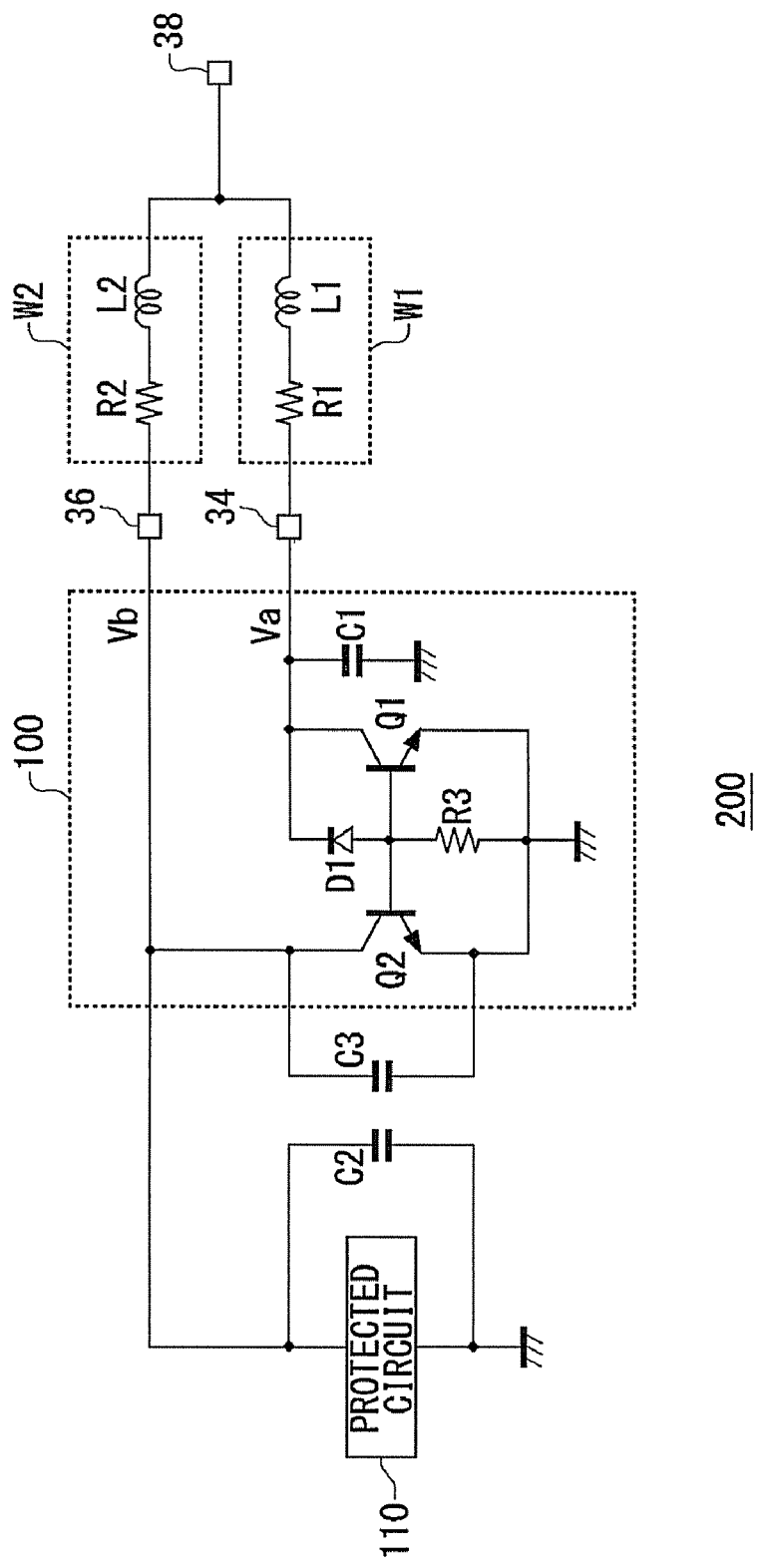
FIG. 5 is a circuit diagram showing a configuration of the LED driver circuit including the protection circuit according to an embodiment of the present invention.

FIG. 5 is a circuit diagram showing a configuration of the LED driver circuit 200 including the protection circuit 100 according to the present embodiment.

The LED driver circuit 200 includes the protection circuit 100 and the protected circuit 110, and the protection circuit 100 and the protected circuit 110 are connected via the bonding wires W1 and W2 that include inductance components L1 and L2. The inductance components L1 and L2 included in the bonding wires W1 and W2 are dependant upon bonding wire length and thickness, but since the inductance components are normally less than or equal to 1 nH or of the order of 1 nH, an undesired LCR oscillation circuit is formed due to a combination of another capacitance component and resistance component.

The protection circuit 100 is provided with a first transistor Q1, a second transistor Q2, a diode D1, and a resistor R3.

The first transistor Q1 is an NPN bipolar transistor, and is arranged on a path to ground, from the bonding pad 34, which is a connection point of the protection circuit 100 and the bonding wire W1; an emitter thereof is grounded and a collector is connected to a bonding pad 34.

The diode D1 is arranged between a base and the collector of the first transistor Q1; a cathode thereof is connected to the collector of the first transistor Q1, and an anode thereof is connected to the base of the first transistor Q1. Furthermore, the resistor R3 is arranged between the base and the emitter of the first transistor Q1.

The second transistor Q2 is an NPN bipolar transistor similar to the first transistor Q1, and is arranged on a path to ground, from the bonding pad 36, which is a connection point of the protected circuit 110 and the bonding wire W2. An emitter of the second transistor Q2 is grounded, and a collector is connected to the bonding pad 36.

The bases and the emitters of the first transistor Q1 and the second transistor Q2 are commonly connected. In the present embodiment, transistor sizes of the first transistor Q1 and the second transistor Q2 are configured to be approximately the same. As a result, the second transistor Q2 extracts a current of the same amount as a current flowing in the first transistor Q1, from the bonding pad 36.

In the figure, C1 to C3 represent parasitic capacitances in the LED driver circuit 200. The parasitic capacitance C1 is mainly capacitance between the collector and the emitter of the first transistor Q1 of the protection circuit 100; the parasitic capacitance C2 is mainly capacitance between a drain and a source of a drive transistor M1 inside the protected circuit 110; and parasitic capacitance C3 is mainly capacitance between the collector and the emitter of the second transistor Q2 of the protection circuit 100. That is, the parasitic capacitance C1 exists between the bonding pad 34 and ground, and a parasitic capacitance (C2+C3) exists between the bonding pad 36 and ground. Here, in cases in which C2<C1 holds, since the sizes of the first transistor Q1 and the second transistor Q2 are configured to be the same, C1≈(C2+C3) holds. In this way, the capacitance between the bonding pad 34 and ground, and the capacitance between the bonding pad 36 and ground are approximately equal.

Figure 6:
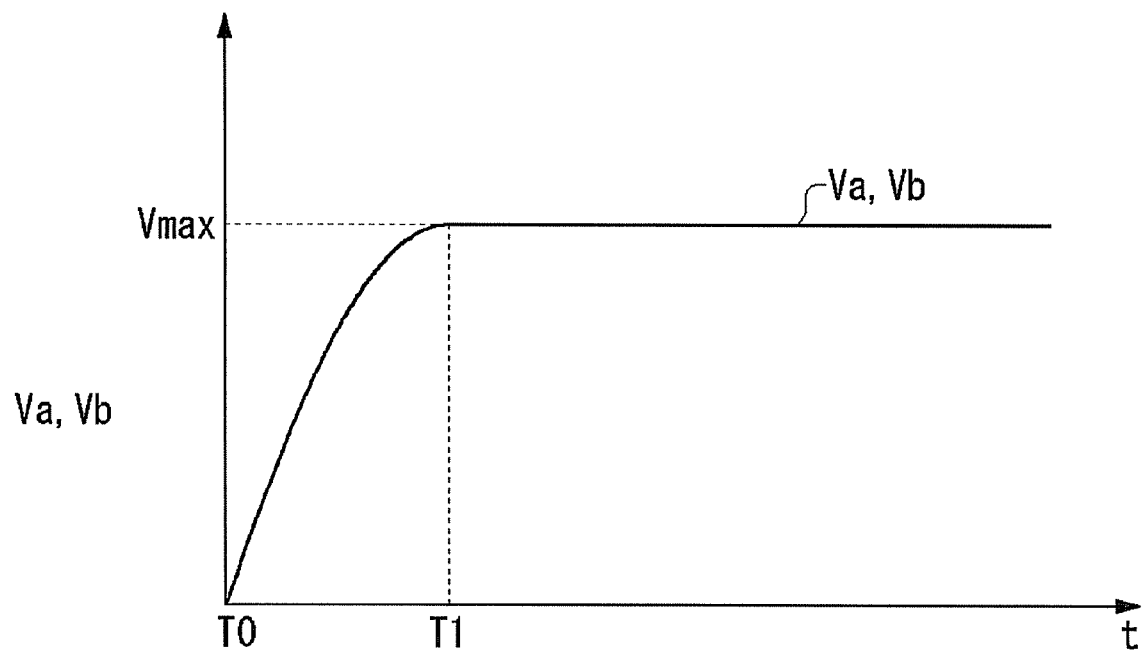
FIG. 6 is an operation waveform diagram of the LED driver circuit of FIG. 5.

An explanation will be given concerning operation of the LED driver circuit 200 configured as above. FIG. 6 is an operation waveform diagram of the LED driver circuit 200 of FIG. 5.

At time T0, when a surge voltage is inputted from the bonding pad 38, voltage of the bonding pad 38 rises, and accompanying this, voltage Va of the bonding pad 34 and voltage Vb of the bonding pad 36 rise. When the voltage Va of the bonding pad 34 rises and exceeds a Zener voltage Vz of the diode D1, a reverse current directed from cathode to anode of the diode D1 flows, and the first transistor Q1 is ON.

As described above, the transistor sizes of the first transistor Q1 and the second transistor Q2 are configured to be approximately the same, so that the parasitic capacitances of the bonding pad 34 and the bonding pad 36 are approximately equal. Parasitic capacitance values being equal means that charge amounts stored when electrical potential is the same are approximately equal, so that it is possible to reduce transfer of charge via the inductance components L1 and L2 between the parasitic capacitances. As a result, the LCR oscillation, which occurs when the voltage Vb of the bonding pad 36 rises with a rise in the voltage Va of the bonding pad 34, is suppressed, and the voltage Vb of the bonding pad 36 does not oscillate, but rises, following the voltage Va of the bonding pad 34.

As described above, the transistor sizes of the first transistor Q1 and the second transistor Q2 are configured to be approximately the same, so that a current Iq1 flowing in the first transistor Q1 and a current Iq2 flowing in the second transistor Q2 are approximately equal. As a result, even after the voltages Va and Vb of the bonding pads 34 and 36 reach Vmax=Vz+Vbe at time T1 and are clamped, the same amount of current is extracted from the bonding pad 34 and the bonding pad 36.

By continually extracting approximately the same amount of current from the bonding pad 34 and the bonding pad 36, even after time T1, it is possible to prevent the voltage Vb of the bonding pad 36 fluctuating due to the LCR oscillation.

In this way, according to the protection circuit 100 according to the present embodiment, it is possible to suppress oscillation of the voltage Vb applied to the protected circuit 110, and to clamp the voltage at a predetermined voltage Vmax; it is possible to prevent voltage greater than or equal to the predetermined voltage Vmax from being applied to the protected circuit 110, and to provide more secure protection.

This embodiment is an example; various modified examples of combinations of various component elements and various processes thereof are possible, and a person skilled in the art will understand that such modified examples are within the scope of the present invention.

For example, in the protection circuit 100 of FIG. 5, the first transistor Q1 and the second transistor Q2 may be PNP bipolar transistors. In such cases, by connecting the resistor R3 between the base and the emitter, and the diode D1 between the base and the collector, it is possible to clamp the voltage of the bonding pads 34 and 36.

Furthermore, in the protection circuit 100, the diode D1 may be connected in multiple stages between the base and the collector of the first transistor Q1. The clamp voltage can be according to the number of stages of the diode D1. Furthermore, a resistance element or a diode may be arranged on a current path form of the first transistor Q1 or the second transistor Q2.

There are different variations of format of the protection circuit 100, and the circuit format thereof is not particularly limited to the circuit diagram shown in FIG. 5; the first transistor Q1 may be arranged on a path to ground from the bonding pad 34 and may be ON in an overvoltage state, and the second transistor Q2 may be arranged in parallel to the first transistor Q1, and may be provided on a path to ground from the bonding pad 36.

In the embodiment, an explanation has been given concerning cases in which transistor sizes of the first transistor Q1 and the second transistor Q2 are configured to be approximately the same. Here, "approximately the same" means sizes at which inhibition of the LCR oscillation is possible; for example, if in a range of ½ to double, it is possible to adequately inhibit the LCR oscillation.

Furthermore, even if the size ratio of the first transistor Q1 and the second transistor Q2 is outside this range, the voltage Vb of the bonding pad 36 may oscillate a little, but compared to cases in which the second transistor Q2 is not provided, it is possible to realize an effect in which the LCR oscillation is suppressed.

Furthermore, in the embodiment, an explanation was given concerning cases in which the protection circuit 100 is arranged in the LED driver circuit, but there is no limitation thereto, and various circuits can be used in which the protection circuit and the protected circuit are connected via a line including a significant inductance component such as a bonding wire.

In addition, in the embodiment an explanation has been given concerning cases in which the line that has the inductance component is a bonding wire, but there is no limitation thereto. For example, in cases of a wafer level CSP (Chip Size Package), the bonding pads 34 and 36 are connected by post and rewiring. In such cases, since the post and rewiring include the inductance component, by using the protection circuit 100 according to the present embodiment, it is possible to preferably suppress the LCR oscillation.

While the preferred embodiments of the present invention have been described using specific terms, such description is for illustrative purposes only, and it is to be understood that changes and variations may be made without departing from the spirit or scope of the appended claims.

The invention claimed is:

1. A protection circuit connected via a line including a significant inductance component to a circuit to be protected, comprising:
  a first transistor arranged on a path to ground from a connection point of the protection circuit and the line; and
  a second transistor arranged on a path to ground from a connection point of the circuit to be protected and the line, the second transistor extracting, from the connection point, a current corresponding to a current flowing in the first transistor.

2. A protection circuit according to claim 1, wherein the first and the second transistors are bipolar transistors having a base and an emitter commonly connected.

3. A protection circuit according to claim 2, wherein the first and the second transistors are NPN bipolar transistors, a collector of the first transistor being connected to a connection point of the protection circuit and the wire, a collector of the second transistor being connected to a connection point of the circuit to be protected and the wire, and a commonly connected emitter being grounded, the protection circuit further comprising:
  a resistor arranged between a base and an emitter of the first transistor; and
  a diode with a cathode connected to the collector of the first transistor, and an anode connected to the base of the first transistor.

4. A protection circuit according to claim 1, wherein transistor sizes of the first and the second transistor are configured to be approximately the same.

5. A protection circuit according to claim 1, wherein
the protection circuit is integrated on a same semiconductor substrate as the circuit to be protected, and the circuit to be protected and the protection circuit are each provided with bonding pads; and
the respective bonding pads are connected by a bonding wire equivalent to the wire, via a terminal arranged on a base on which the semiconductor substrate is mounted.

6. A semiconductor device comprising:
a driver circuit which is connected to a cathode of a light emitting diode and which controls emitted quantity of light of the light emitting diode; and
a protection circuit provided with the driver circuit as a circuit to be protected, connected via a line including a significant inductance component to the driver circuit, the protection circuit comprising:
a first transistor arranged on a path to ground from a connection point of the protection circuit and the line; and
a second transistor arranged on a path to ground from a connection point of the driver circuit and the line, the second transistor extracting, from the connection point, a current corresponding to a current flowing in the first transistor.

7. A light emitting apparatus comprising:
a light emitting diode; and
a semiconductor device which drives the light emitting diode, the semiconductor device comprising:
a driver circuit which is connected to a cathode of a light emitting diode and which controls emitted quantity of light of the light emitting diode; and
a protection circuit provided with the driver circuit as a circuit to be protected, connected via a line including a significant inductance component to the driver circuit, the protection circuit comprising:
a first transistor arranged on a path to ground from a connection point of the protection circuit and the line; and
a second transistor arranged on a path to ground from a connection point of the driver circuit and the line, the second transistor extracting, from the connection point, a current corresponding to a current flowing in the first transistor.

* * * * *